(12) United States Patent
Pinarbasi

(10) Patent No.: US 6,398,924 B1
(45) Date of Patent: Jun. 4, 2002

(54) SPIN VALVE SENSOR WITH IMPROVED PINNING FIELD BETWEEN NICKEL OXIDE (NIO) PINNING LAYER AND PINNED LAYER

(75) Inventor: Mustafa Pinarbasi, Morgan Hill, CA (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/342,604

(22) Filed: Jun. 29, 1999

(51) Int. Cl.[7] ............... C23C 14/34; C23C 16/00; C23F 1/00
(52) U.S. Cl. ............ 204/192.2; 204/192.35; 427/130; 427/131; 216/66
(58) Field of Search .............. 204/192.2, 192.35; 427/131, 130; 216/22, 66

(56) References Cited

U.S. PATENT DOCUMENTS

| | | | |
|---|---|---|---|
| 4,476,000 A | | 10/1984 | Nagao et al. ............ 204/192 |
| 5,492,720 A | * | 2/1996 | Gill et al. ............ 427/131 |
| 5,508,866 A | | 4/1996 | Gill et al. ............ 360/113 |
| 5,591,532 A | * | 1/1997 | Berkowitz ............ 428/611 |
| 5,606,478 A | * | 2/1997 | Chen et al. ............ 360/126 |
| 5,648,885 A | * | 7/1997 | Nishioka et al. ....... 360/324.12 |
| 5,701,223 A | * | 12/1997 | Fontana, Jr. et al. .... 360/324.11 |
| 5,715,120 A | * | 2/1998 | Gill ............ 360/327.22 |
| 5,741,405 A | | 4/1998 | Statnikov et al. ....... 204/192.14 |
| 5,764,446 A | * | 6/1998 | Seagle ............ 360/322 |
| 5,768,071 A | | 6/1998 | Lin ............ 360/113 |

* cited by examiner

Primary Examiner—Nam Nguyen
Assistant Examiner—Gregg Cantelmo
(74) Attorney, Agent, or Firm—Ervin F. Johnston; Gray Cary Ware & Freidenrich

(57) ABSTRACT

A method prepares the top exposed surface of a pinning layer after its sputter deposition for an improved exchange coupling with a sputter deposited pinned layer even though the top surface of the pinning layer has been degraded by exposure to the atmosphere. In a preferred method the relatively thick pinning layer is sputter deposited in a first chamber which has a high sputtering rate and is transferred to a second sputtering chamber where the pinned layer, as well as other layers of a spin valve sensor, are sputter deposited. After transfer to the second sputtering chamber the top surface of the nickel oxide (NiO) pinning layer is sputter etched and a thin layer of nickel oxide (NiO) is sputter deposited thereon followed by sputter deposition of the pinned layer. In a preferred embodiment the thickness of the nickel oxide (NiO) pinning layer portion sputter deposited in the second chamber is approximately 40 Å.

31 Claims, 13 Drawing Sheets

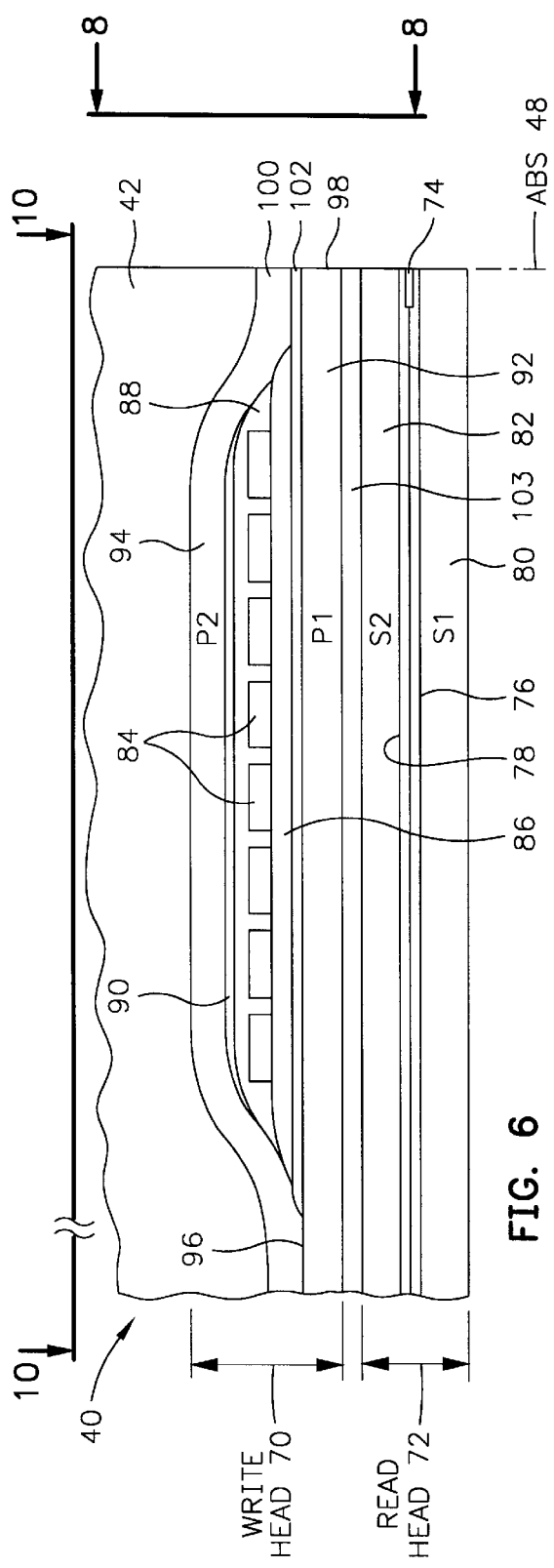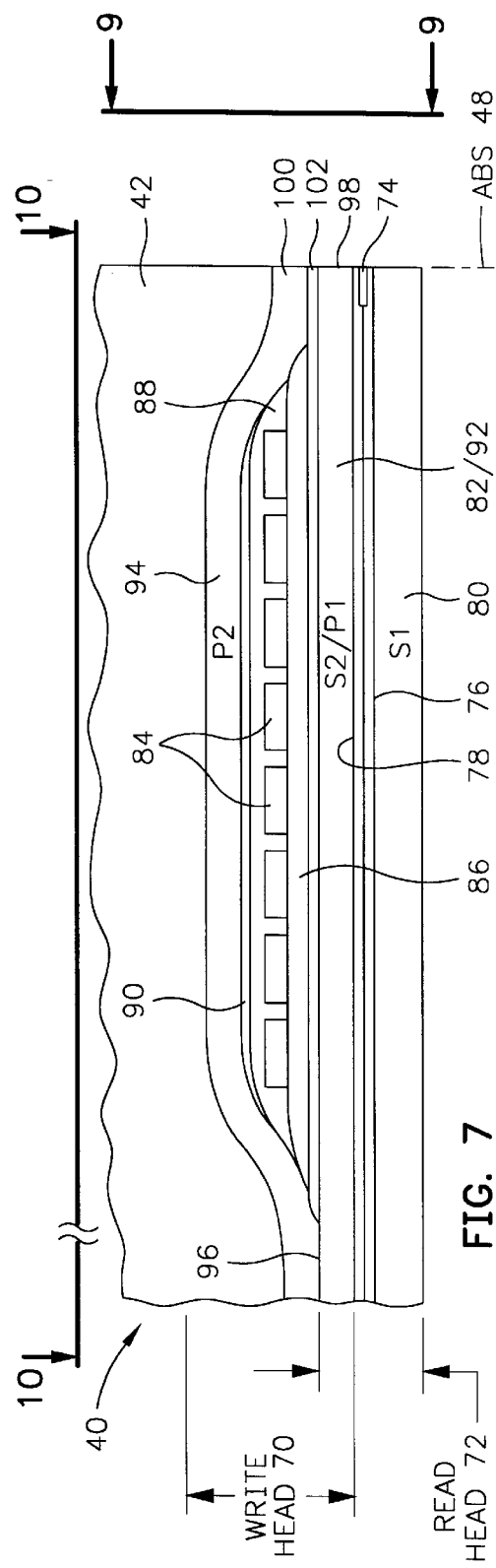

(ABS)

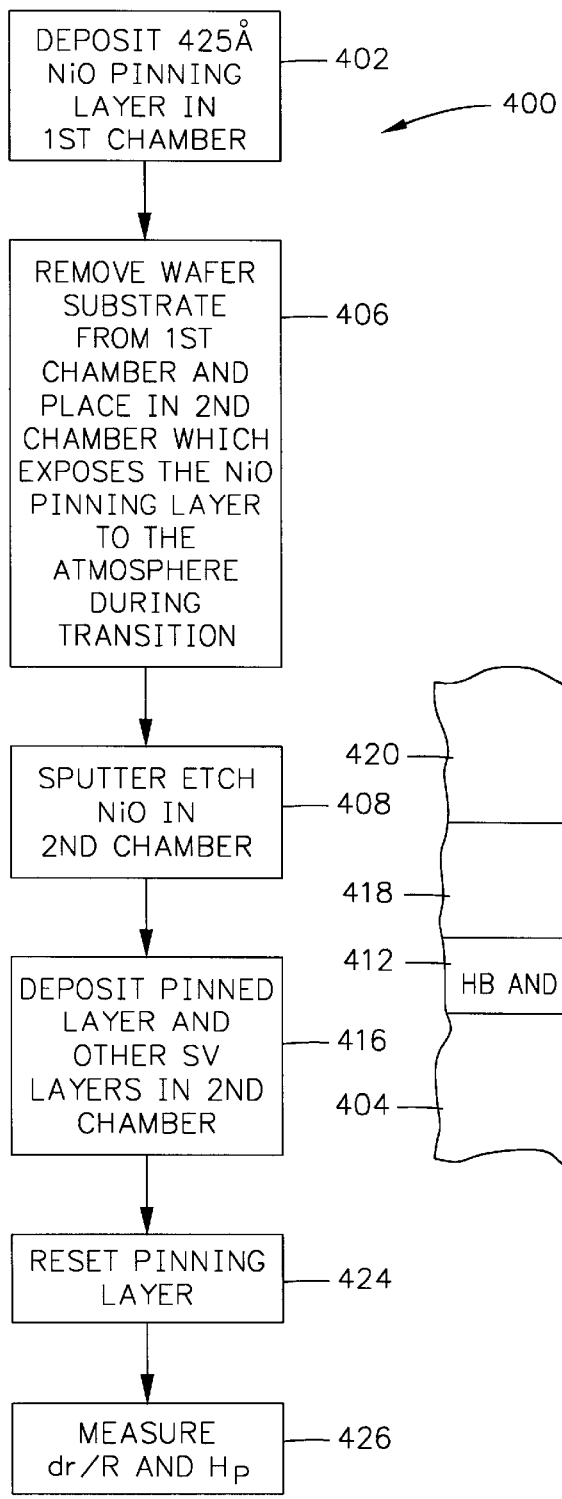
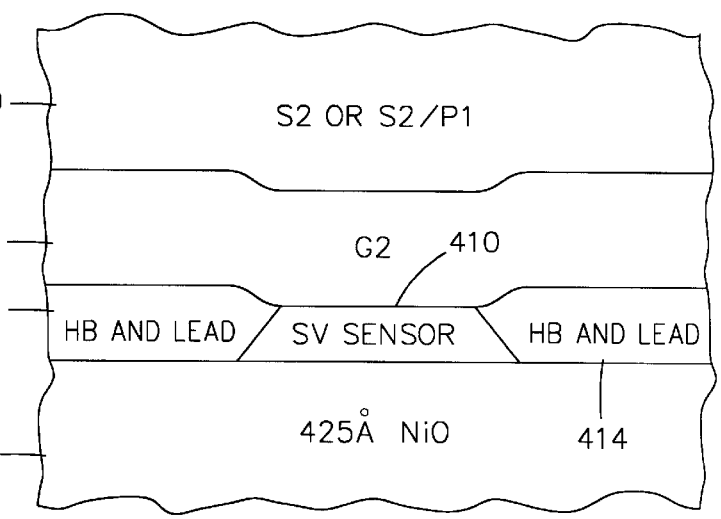
FIG. 18B
FIG. 18A

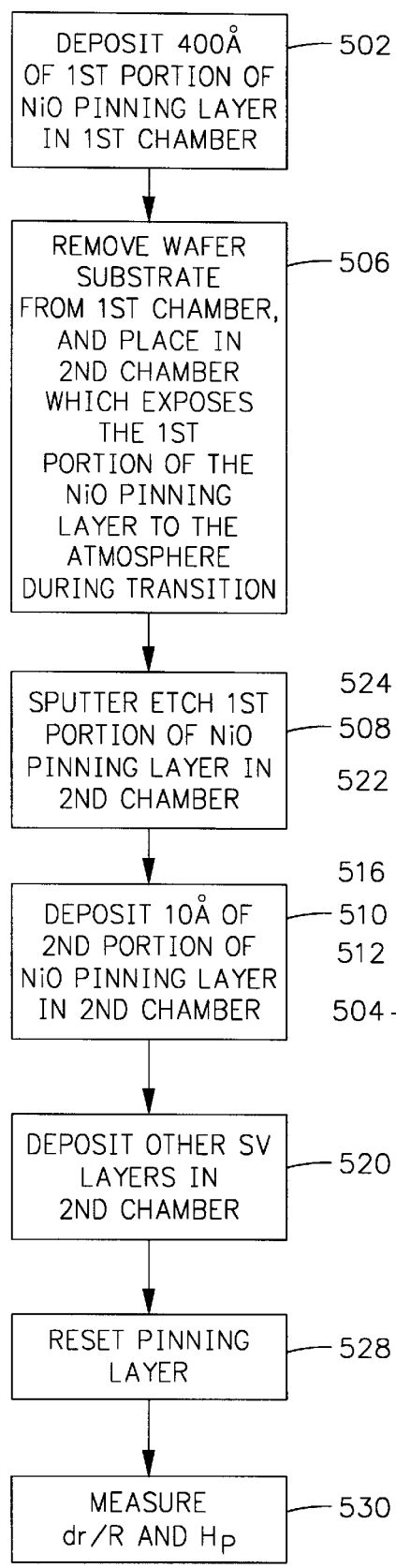
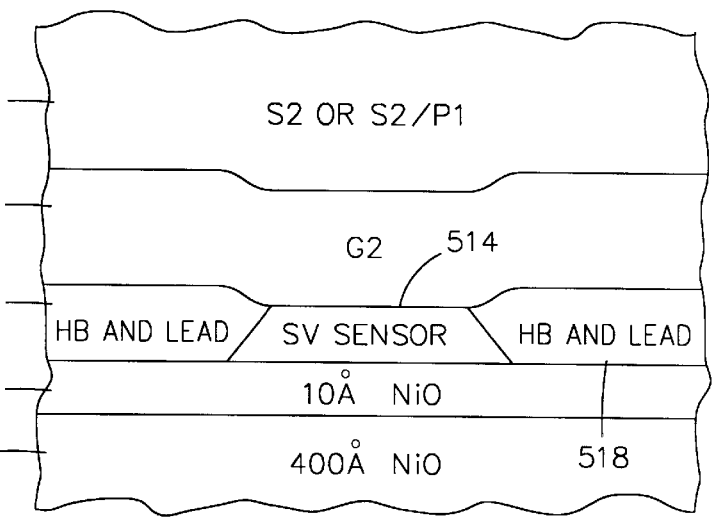
FIG. 19B
FIG. 19A

```
┌─────────────────┐
│ DEPOSIT 400Å    │─── 602
│ OF 1ST PORTION OF│        ─── 600
│ NiO PINNING LAYER│
│ IN 1ST CHAMBER  │
└────────┬────────┘
         ▼
┌─────────────────┐
│ REMOVE WAFER    │─── 606
│ SUBSTRATE       │
│ FROM 1ST CHAMBER,│
│ AND PLACE IN    │
│ 2ND CHAMBER     │
│ WHICH EXPOSES   │
│ THE 1ST         │
│ PORTION OF THE  │
│ NiO PINNING     │
│ LAYER TO THE    │
│ ATMOSPHERE      │
│ DURING TRANSITION│
└────────┬────────┘
         ▼
┌─────────────────┐
│ SPUTTER ETCH 1ST│─── 610
│ PORTION OF NiO  │
│ PINNING LAYER IN│
│ 2ND CHAMBER     │
└────────┬────────┘
         ▼
┌─────────────────┐
│ DEPOSIT 20Å OF  │─── 614
│ 2ND PORTION OF  │
│ NiO PINNING LAYER│
│ IN 2ND CHAMBER  │
└────────┬────────┘
         ▼
┌─────────────────┐
│ DEPOSIT PINNED  │
│ LAYER AND OTHER │─── 616
│ SV LAYERS IN    │
│ 2ND CHAMBER     │
└────────┬────────┘
         ▼
┌─────────────────┐
│ RESET PINNING   │─── 628
│ LAYER           │
└────────┬────────┘
         ▼
┌─────────────────┐
│ MEASURE         │─── 630
│ dr/R AND Hp     │
└─────────────────┘
```

FIG. 20A

625 — S2 OR S2/P1
624 — G2  618
620 — HB AND LEAD | SV SENSOR | HB AND LEAD  622
614 —
612 — 20Å NiO
604 — 400Å NiO

FIG. 20B

SPIN VALVE SENSOR WITH IMPROVED PINNING FIELD BETWEEN NICKEL OXIDE (NIO) PINNING LAYER AND PINNED LAYER

BACKGROUND OF THE INVENTION

1. Field of the Invention

The present invention relates to an improved pinning field between a nickel oxide pinning layer and a pinned layer of a spin valve sensor and, more particularly, to a method of improving the pinning field when the nickel oxide pinning layer has been exposed to atmosphere before forming the pinned layer thereon.

2. Description of the Related Art

An exemplary high performance read head employs a spin valve sensor for sensing magnetic fields on a moving magnetic medium, such as a rotating magnetic disk or a linearly moving magnetic tape. The sensor includes a non-magnetic electrically conductive first spacer layer sandwiched between a ferromagnetic pinned layer and a ferromagnetic free layer. An antiferromagnetic pinning layer interfaces the pinned layer for pinning the magnetic moment of the pinned layer 90° to an air bearing surface (ABS) which is an exposed surface of the sensor that faces the magnetic medium. First and second leads are connected to the spin valve sensor for conducting a sense current therethrough. The magnetic moment of the free layer is free to rotate in positive and negative directions from a quiescent or zero bias point position in response to positive and negative magnetic signal fields from a moving magnetic medium. The quiescent position is the position of the magnetic moment of the free layer when the sense current is conducted through the sensor without magnetic field signals from a rotating magnetic disk. The quiescent position of the magnetic moment of the free layer is preferably parallel to the ABS.

The antiferromagnetic pinning layer is typically nickel oxide (NiO). It is important that a high quality interface be formed between the pinning and pinned layers for promoting a high pinning field therebetween. The pinning field is related to the aforementioned exchange coupling field. The antiferromagnetic pinning layer has magnetic spins that are oriented in the desired pinned direction of the pinned layer. When the pinned layer interfaces the antiferromagnetic pinning layer, or interfaces another ferromagnetic layer therebetween, the magnetic moment of the pinned layer is oriented in a direction which is parallel to the magnetic spins of the antiferromagnetic pinning layer at its interface. When the interface of the antiferromagnetic pinning layer is degraded by contamination or roughness the exchange coupling and the pinning field between the pinning and pinned layers is reduced. Unfortunately, contamination of a top exposed surface of the antiferromagnetic pinning layer can take place during the processes of making the read head. The pinned, spacer and free layers are thin layers, on the order of 20 Å–50 Å, 20 Å–25 Å and 40 Å–70 Å, respectively. In contrast, the thicknesses of the first and second shield layers is typically 1–2 μm, the thickness of the first and second gap layers is typically in a range 300 Å–1000 Å and the thickness of the antiferromagnetic pinning layer is typically 425 Å.

It is desirable to form the antiferromagnetic oxide pinning layer in a first chamber and then form the pinned, spacer and free layers in a second chamber. The reason for this is because sputtering chambers are optimized for different functions, such as rate of sputtering, type of sputtering and pumping parameters. The first chamber may be optimized with a high sputtering deposition rate for sputter depositing the thicker first gap layer and the antiferromagnetic pinning layer while the second chamber may be optimized with a low sputter deposition rate for depositing the thinner pinned, spacer and free layers. The reason that a low sputter deposition rate second chamber is employed for the pinned, spacer and free layers is so that the thicknesses of these layers can be precisely formed.

Unfortunately, when the wafer with the antiferromagnetic pinning layer is removed from the first chamber and placed in the second chamber, the antiferromagnetic pinning layer has a top surface that is exposed to the atmosphere. This exposure seriously degrades the top surface of the antiferromagnetic pinning layer causing a very poor exchange coupling between the pinning layer and the pinned layer that is sputter deposited in the second chamber. Accordingly, the top surface of the antiferromagnetic pinning layer is sputter etched in the second chamber to clean the surface before sputter depositing the subsequent layers. Even with the sputter etch cleaning the exchange coupling is not as good if the antiferromagnetic had not been exposed to the atmosphere and sputter etch cleaned.

When exchange coupling between the pinning and pinned layers is low the magnetic moment of the pinned layer can be easily rotated from a direction perpendicular to the ABS. During subsequent fabrication steps of the remainder of the read head and the write head, the pinned layer is subjected to magnetic fields that are directed parallel to the ABS. Further, after the completed magnetic head assembly is mounted in a magnetic disk drive the read head may be subjected to extraneous magnetic fields parallel to the ABS that have a field stronger than the pinning field Hp between the pinning and pinned layers. The extraneous fields can cause the magnetic moment of the pinned layer to switch from the pinned direction perpendicular to the ABS to some other direction. Accordingly, there is a strong-felt need for providing a method of promoting a strong exchange coupling field between a pinning and pinned layer when the pinning layer is exposed to the atmosphere prior to formation of the pinned layer on the pinning layer.

SUMMARY OF THE INVENTION

I have provided a method of making the pinning and pinned layers with a high exchange coupling therebetween even though the pinning layer has been subjected to the atmosphere such as when the pinning layer, after its formation in a first chamber, is relocated to a second chamber. The method is implemented after the pinning layer is relocated in the second sputtering chamber. In the second sputtering chamber the top surface of the pinning layer is sputter etched in order to clean its surface and remove any contamination. A second layer of nickel oxide (NiO) is then sputter deposited on the first portion of the nickel oxide pinning layer with a predetermined thickness. The preferred thickness is in the range of 20 Å–100 Å with the best thickness of this range being 40 Å. The thickness of the first portion of the nickel oxide (NiO) layer is typically 400 Å. When the second portion of the nickel oxide pinning layer is 40 Å it is found that the pinning field ($H_P$) between the pinning and pinned layers was even higher than the pinning field between these layers when the entire pinning layer was sputter deposited in the second chamber. This was a surprising result even though the main objective was to overcome the problem of atmosphere contamination of the pinning layer when the pinning layer was constructed in a first chamber and the pinned layer was constructed in a second chamber. It should be understood that the invention not only has application to construction of the pinning and pinned layers in first and second chambers but also has application to methods where a period of time passes after the construction of the pinning layer and before the construction of the pinned layer.

An object of the present invention is to improve the pinning field between a nickel oxide (NiO) pinning layer and a ferromagnetic pinned layer.

Another object is to provide a method of making a nickel oxide (NiO) pinning layer in a first chamber and making a ferromagnetic pinned layer in a second chamber wherein exchange coupling between these layers is not degraded by exposing the pinning layer to the atmosphere when it is relocated from the first chamber to the second chamber.

Other objects and advantages of the invention will become apparent upon reading the following description taken together with the accompanying drawings.

BRIEF DESCRIPTION OF THE DRAWINGS

FIG. 6 is a partial view of the slider and a piggyback magnetic head as seen in plane 6—6 of FIG. 2;

FIG. 7 is a partial view of the slider and a merged magnetic head as seen in plane 7—7 of FIG. 2;

FIG. 18A is a block diagram of a second example of making and testing pinning and pinned layers;

FIG. 18B is an ABS illustration of a portion of the read head made according to the method shown in FIG. 18A;

FIG. 19A is a block diagram of a third method according to the present invention of making and testing pinning and pinned layers;

FIG. 19B is an ABS illustration of a portion of the read head made according to the method shown in FIG. 19A;

FIG. 20A is a block diagram of a fourth method of making and testing pinning and pinned layers according the present invention;

FIG. 20B is an ABS illustration of a portion of the read head made according to the method shown in FIG. 20A;

DESCRIPTION OF THE PREFERRED EMBODIMENTS

Magnetic Disk Drive

Figure 1:
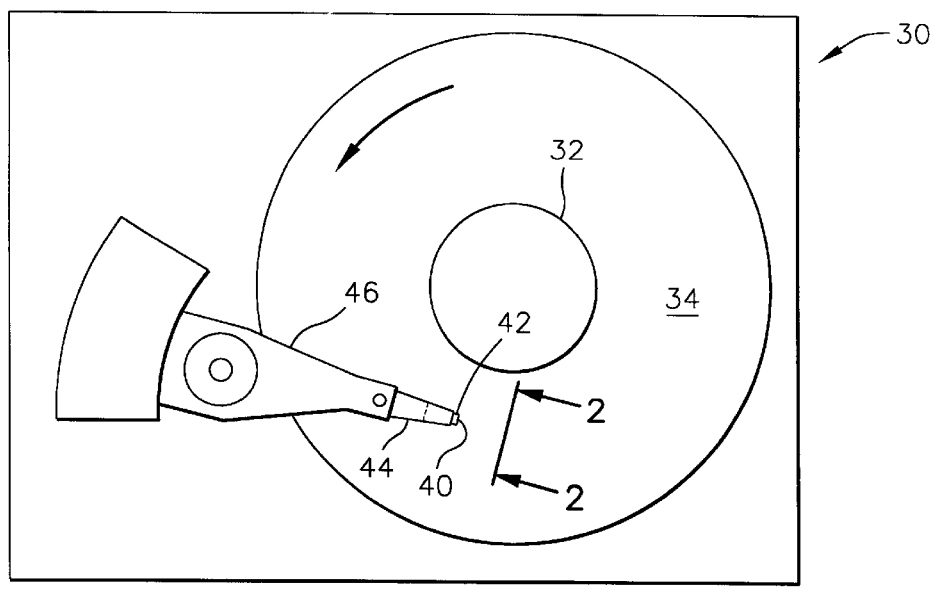
FIG. 1 is a plan view of an exemplary magnetic disk drive.
Figure 2:
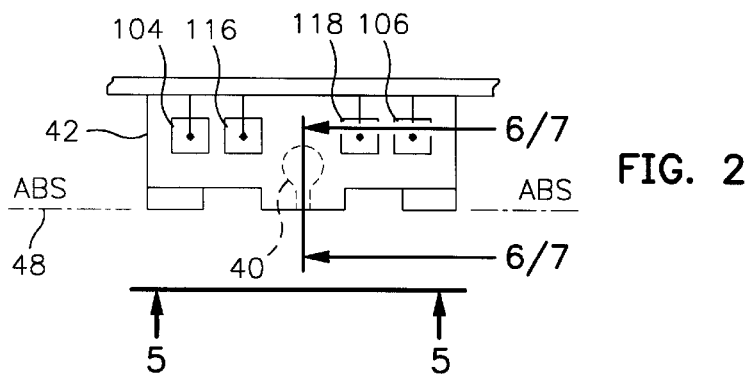
FIG. 2 is an end view of a slider with a magnetic head of the disk drive as seen in plane 2—2.
Figure 3:
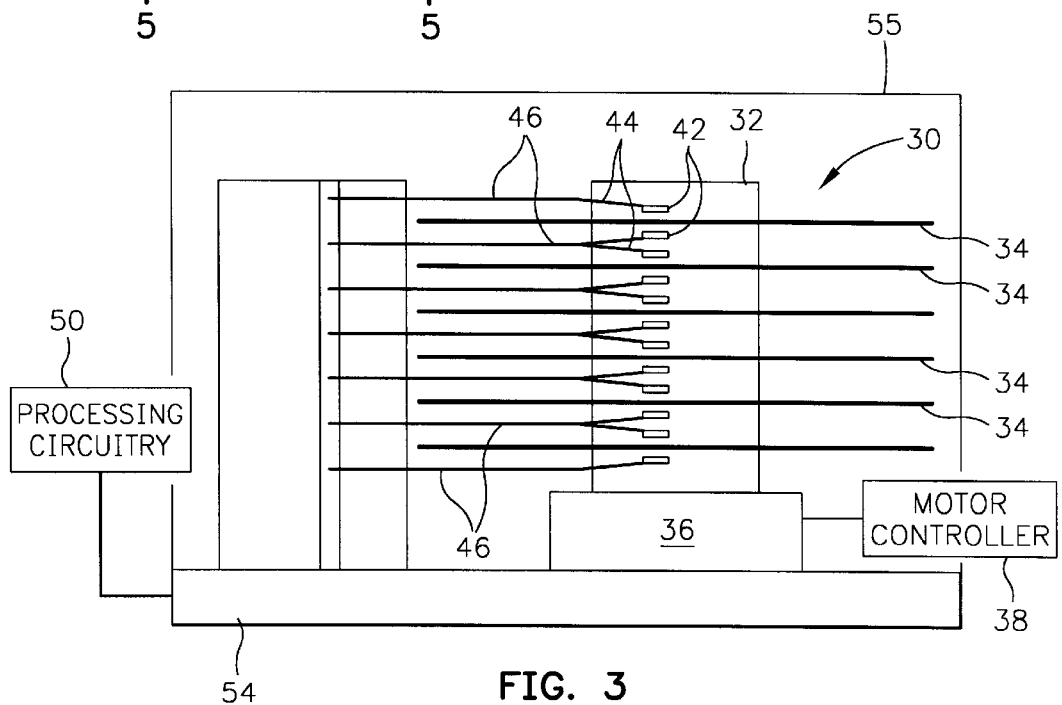
FIG. 3 is an elevation view of the magnetic disk drive wherein multiple disks and magnetic heads are employed.
Figure 4:
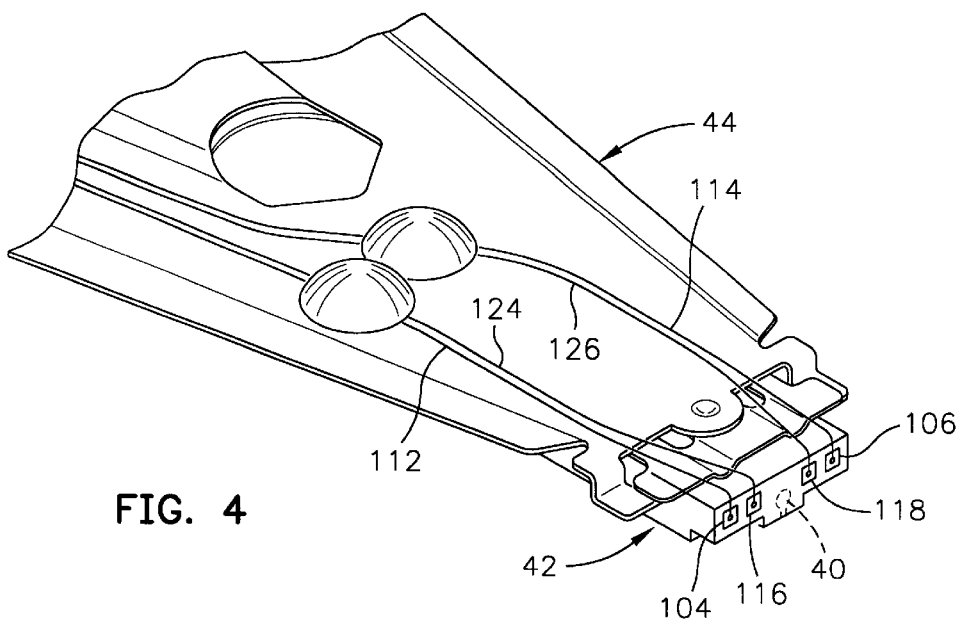
FIG. 4 is an isometric illustration of an exemplary suspension system for supporting the slider and magnetic head.

Referring now to the drawings wherein like reference numerals designate like or similar parts throughout the several views, FIGS. 1–3 illustrate a magnetic disk drive 30. The drive 30 includes a spindle 32 that supports and rotates a magnetic disk 34. The spindle 32 is rotated by a spindle motor 36 that is controlled by a motor controller 38. A combined read and write magnetic head 40 is mounted on a slider 42 that is supported by a suspension 44 and actuator arm 46 which is rotatably positioned by an actuator 47. A plurality of disks, sliders and suspensions may be employed in a large capacity direct access storage device (DASD) as shown in FIG. 3. The suspension 44 and actuator arm 46 position the slider 42 so that the magnetic head 40 is in a transducing relationship with a surface of the magnetic disk 34. When the disk 34 is rotated by the motor 36 the slider is supported on a thin (typically, 0.05 μm) cushion of air (air bearing) between the surface of the disk 34 and the air bearing surface (ABS) 48. The magnetic head 40 may then be employed for writing information to multiple circular tracks on the surface of the disk 34, as well as for reading information therefrom. Processing circuitry 50 exchanges signals, representing such as information, with the head 40, provides motor drive signals for rotating the magnetic disk 34, and provides control signals to the actuator 47 for moving the slider to various tracks. In FIG. 4 the slider 42 is shown mounted to a suspension 44. The components described hereinabove may be mounted on a frame 54 of a housing, as shown in FIG. 3.

Figure 5:
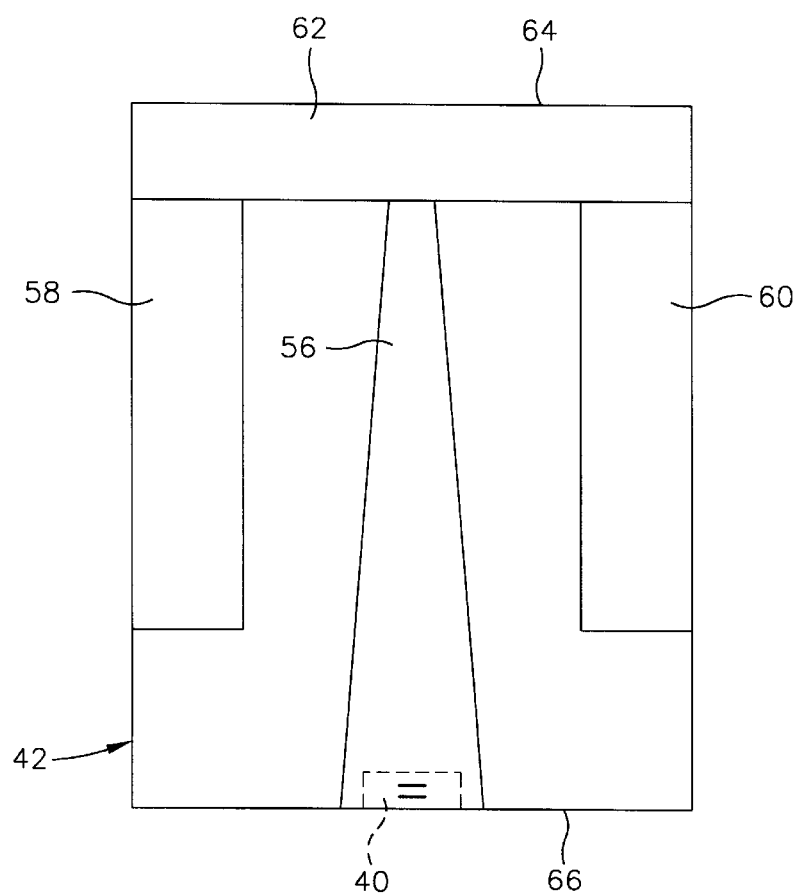
FIG. 5 is an ABS view of the magnetic head taken along plane 5—5 of FIG. 2.
Figure 10:
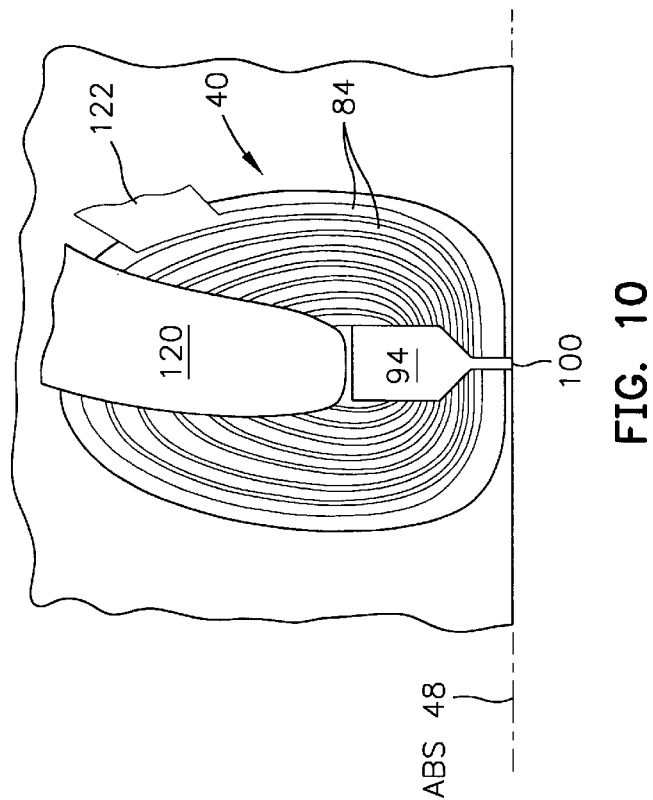
FIG. 10 is a view taken along plane 10—10 of FIGS. 6 or 7 with all material above the coil layer and leads removed.

FIG. 5 is an ABS view of the slider 42 and the magnetic head 40. The slider has a center rail 56 that supports the magnetic head 40, and side rails 58 and 60. The rails 56, 58 and 60 extend from a cross rail 62. With respect to rotation of the magnetic disk 34, the cross rail 62 is at a leading edge 64 of the slider and the magnetic head 40 is at a trailing edge 66 of the slider.

Figure 8:
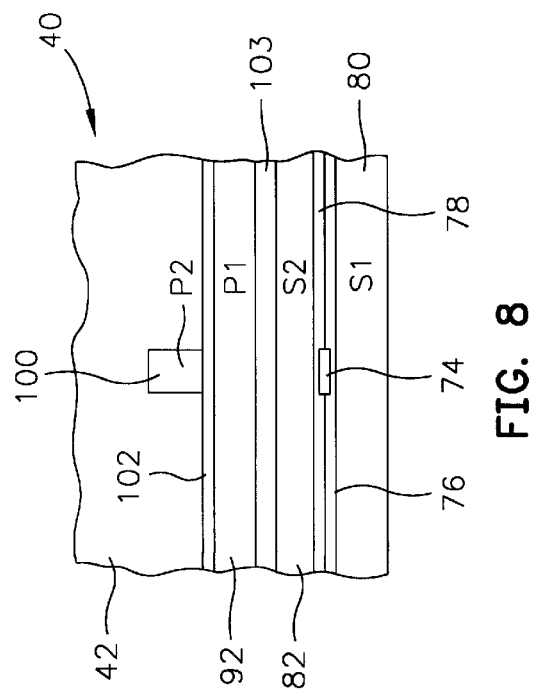
FIG. 8 is a partial ABS view of the slider taken along plane 8—8 of FIG. 6 to show the read and write elements of the piggyback magnetic head.

FIG. 6 is a side cross-sectional elevation view of a piggyback magnetic head 40, which includes a write head portion 70 and a read head portion 72, the read head portion employing an AP pinned spin valve sensor 74. FIG. 8 is an ABS view of FIG. 6. The spin valve sensor 74 is located between nonmagnetic electrically insulative first and second read gap layers 76 and 78, and the read gap layers are located between ferromagnetic first and second shield layers 80 and 82. In response to external magnetic fields, the resistance of the spin valve sensor 74 changes. A sense current Is conducted through the sensor causes these resistance changes to be manifested as potential changes. These potential changes are then processed as readback signals by the processing circuitry 50 shown in FIG. 3.

The write head portion 70 of the magnetic head 40 includes a coil layer 84 sandwiched between first and second insulation layers 86 and 88. A third insulation layer 90 may be employed for planarizing the head to eliminate ripples in the second insulation layer caused by the coil layer 84. The first, second and third insulation layers are referred to in the art as an "insulation stack". The coil layer 84 and the first, second and third insulation layers 86, 88 and 90 are sandwiched between first and second pole piece layers 92 and 94. The first and second pole piece layers 92 and 94 are magnetically coupled at a back gap 96 and have first and second pole tips 98 and 100 which are separated by a write gap layer 102 at the ABS. An insulation layer 103 is located between the second shield layer 82 and the first pole piece layer 92. Since the second shield layer 82 and the first pole piece layer 92 are separate layers this head is known as a piggyback head. As shown in FIGS. 2 and 4, first and second solder connections 104 and 106 connect leads from the spin valve sensor 74 to leads 112 and 114 on the suspension 44, and third and fourth solder connections 116 and 118 connect leads 120 and 122 from the coil 84 (see FIG. 8) to leads 124 and 126 on the suspension.

Figure 9:
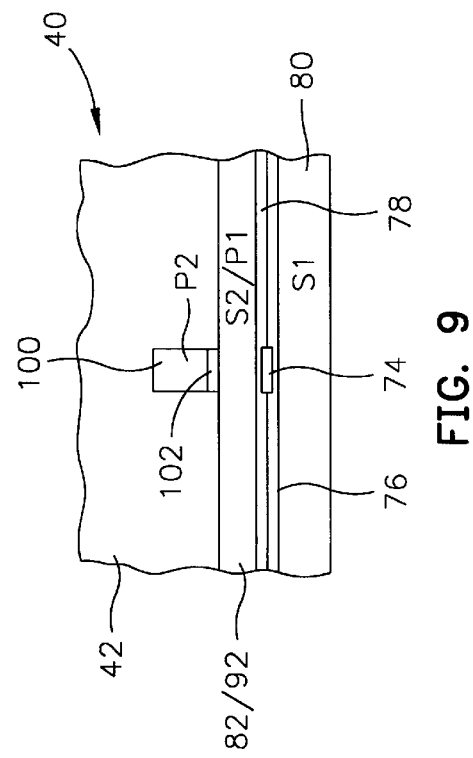
FIG. 9 is a partial ABS view of the slider taken along plane 9—9 of FIG. 7 to show the read and write elements of the merged magnetic head.

FIGS. 7 and 9 are the same as FIGS. 6 and 8 except the second shield layer 82 and the first pole piece layer 92 are a common layer. This type of head is known as a merged magnetic head. The insulation layer 103 of the piggyback head in FIGS. 6 and 8 is omitted.

Figure 11:
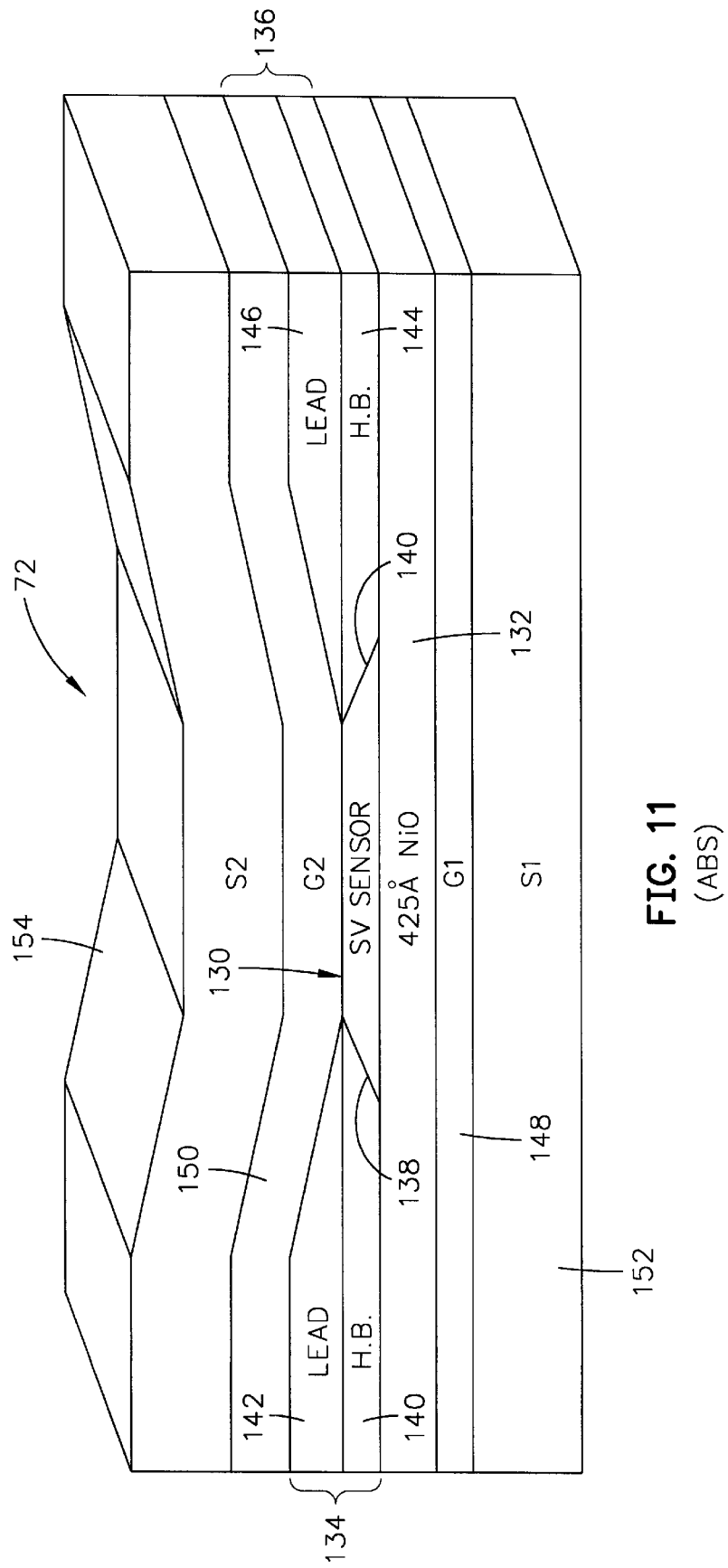
FIG. 11 is an isometric ABS illustration of a read head which employs a spin valve (SV) sensor.

FIG. 11 is an isometric ABS illustration of the read head 72 shown in FIGS. 6 or 8. The read head 72 includes a spin valve sensor 130 which is located on an antiferromagnetic (AFM) pinning layer 132. The spin valve sensor 130 has a pinned layer structure that has a magnetic moment pinned by the magnetic spins of the pinning layer 132. The AFM pinning layer is preferably 425 Å of nickel oxide (NiO). First and second hard bias and lead layers 134 and 136 are connected to first and second side edges 138 and 140 of the spin valve sensor. This connection is known in the art as a contiguous junction. The first hard bias and lead layers 134 include a first hard bias layer 140 and a first lead layer 142 and the second hard bias and lead layers 136 include a second hard bias layer 144 and a second lead layer 146. The hard bias layers 140 and 144 cause magnetic fields to extend longitudinally through the spin valve sensor 130 for stabilizing magnetic domains therein. The AFM pinning layer 132, the spin valve sensor 130 and the first and second hard bias and lead layers 134 and 136 are located between nonmagnetic electrically insulative first and second read gap layers 148 and 150. The first and second read gap layers 148 and 150 are, in turn, located between ferromagnetic first and second shield layers 152 and 154.

The Invention

Figure 12:
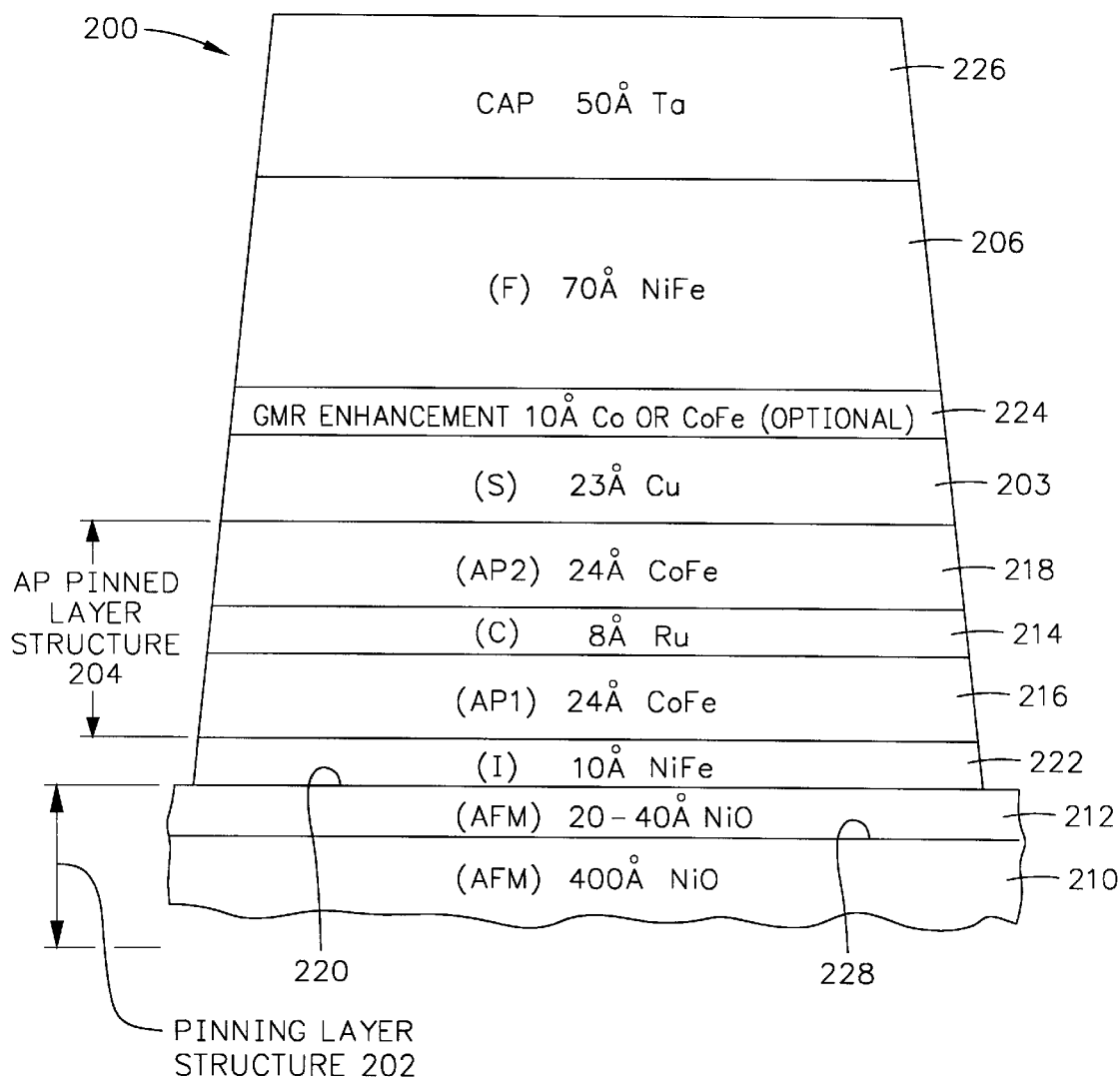
FIG. 12 is an ABS illustration of an exemplary spin valve sensor constructed according to the present invention.

FIG. 12 shows an ABS illustration of a spin valve sensor 200 with a preferred pinning structure 202. The spin valve sensor 200 includes a nonmagnetic electrically conductive spacer layer (S) 203 which is located between a ferromagnetic pinned layer structure, such as an antiparallel (AP) pinned layer structure 204, and a ferromagnetic free layer (F) 206. The AP pinned layer structure 204 is pinned by the pinning layer structure 202 which has first and second portions 210 and 212.

The AP pinned layer structure 204 may include a ruthenium (Ru) coupling layer 214 which is located between a first antiparallel pinning layer (AP1) 216 and a second antiparallel pinning layer (AP2) 218. The first AP pinned layer 216 is exchange coupled to the pinning layer structure 202 by exchange coupling with a top surface 220 of the second portion 212. This may be accomplished by interfacing the first AP pinned layer 216 with the top surface 220 or locating an interfacing layer (I) 220 therebetween, as shown, in which case the first AP pinned layer 216 interfaces the interfacing layer 220 and the interfacing layer 222, in turn, interfaces the top surface 220. The interfacing layer 222 is typically employed between a nickel oxide (NiO) pinning layer and the first AP pinned layer 216 for the purpose of promoting uniform texture of the first AP pinned layer 216 when it is formed by sputter deposition in a sputtering chamber. Further, in a typical spin valve structure a GMR enhancement layer 224 is located between the spacer layer 203 and the free layer 206 for enhancing the spin valve effect (dr/R) of the sensor. A cap layer 226 is employed on top of the free layer 206 for the purpose of protecting the free layer 206 from subsequent processing steps.

Preferred thicknesses of materials for the layers are 400 Å of nickel oxide (NiO) for the first portion 210 of the pinning layer structure, 20 Å–40 Å of nickel oxide (NiO) for the second portion 212 of the pinning layer structure, 10 Å of nickel iron (NiFe) for the interfacing layer 222, 24 Å of cobalt iron (CoFe) for the first AP pinned layer 216, 8 Å of ruthenium (Ru) for the coupling layer 214, 24 Å of cobalt iron (CoFe) for the second AP pinned layer 218, 23 Å of copper (Cu) for the spacer layer 203, 10 Å of cobalt iron (CoFe) for the GMR enhancement layer 224, 70 Å of nickel iron (NiFe) for the free layer 206 and 50 Å of tantalum (Ta) for the cap layer 226.

Figure 13:
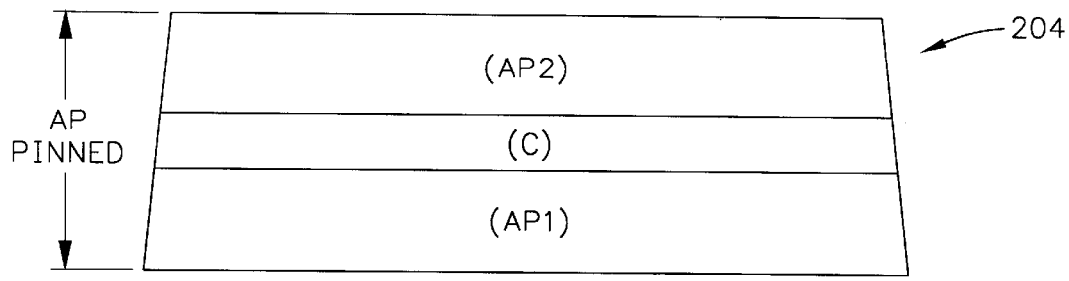
FIG. 13 is an ABS illustration of the AP pinned layer structure of FIG. 12.
Figure 14:
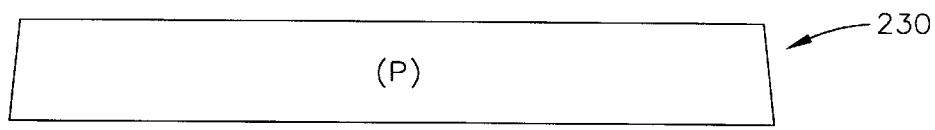
FIG. 14 is an ABS illustration of a single pinned layer structure.

The reason that the pinning layer structure 202 is shown with first and second portions 210 and 212 is that the first and second portions 210 and 212 are formed with separate sputtering deposition steps. For example, the first portion 210 is sputter deposited in a first sputtering chamber and the second portion 212 is sputter deposited in a second sputtering chamber. When this occurs the top surface 228 of the first portion is typically degraded by exposure to the atmosphere when it is transferred from the first chamber to the second chamber. As will be explained in detail hereinafter, the top surface 228 is sputter etched in the second chamber followed by sputter deposition of the second portion 208, the pinned layer structure 204 and, optionally, the interfacing layer 222 in the second chamber. With this method exchange coupling between the pinned layer structure 204 and the pinning layer structure 202 is not degraded by changing chambers and surprisingly is even enhanced over constructing all of these layers in a single chamber, as will be discussed in more detail hereinbelow. FIG. 13 shows an enlarged ABS illustration of just the AP pinned layer structure 204 which is one option for the pinned layer structure. Another option for the pinned layer structure is a single ferromagnetic pinned layer 230 which is shown in FIG. 14 which may directly interface the top surface 220 of the pinning layer structure 202 or be separated therefrom by the interfacing layer 222.

Method of Making

Figure 15:
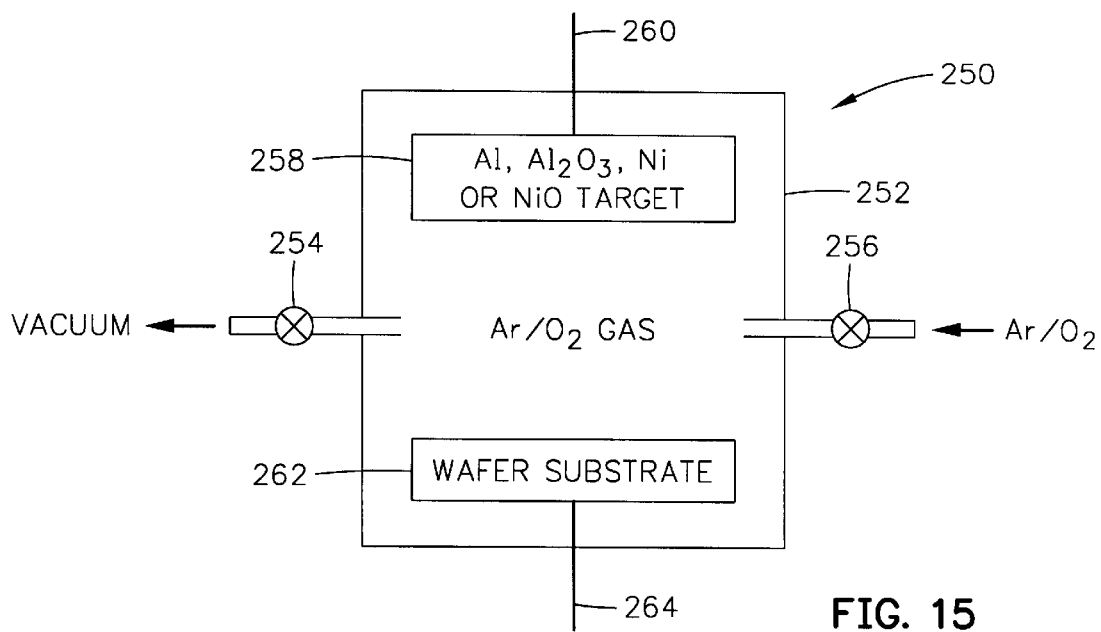
FIG. 15 is a schematic illustration of a first sputtering chamber which has a high sputter deposition rate.

FIG. 15 illustrates a schematic diagram of a first sputtering chamber 250. The first sputtering chamber 250 includes a chamber 252 which has an inlet/outlet and valve assembly 254 for drawing a vacuum in the chamber and an inlet/outlet and valve assembly 256 for introducing desired gases, such as argon (Ar) and oxygen ($O_2$), into the chamber for sputtering purposes. Multiple sputtering targets, such as aluminum (Al) or aluminum oxide ($Al_2O_3$) and nickel (Ni) or nickel oxide (NiO), which may be sequentially employed one at a time in the sputtering chamber, are shown schematically at 258. A negative bias may be applied to the respective target via a lead 260. A wafer substrate is shown at 262 where a material from a target at 258 is sputter deposited thereon. A bias may be applied to the wafer substrate via a lead 264 or it may float without a bias. Argon and oxygen gases may be employed in the chamber 252 for causing aluminum oxide ($Al_2O_3$) or nickel oxide (NiO) to be deposited on the wafer substrate 262. With a proper vacuum and appropriate gases, sputtering is implemented for depositing the required layers. The first sputtering chamber 250 has a high sputtering rate since the aluminum oxide first gap layer (see 148 in FIG. 11) and the nickel oxide pinning layer structure 202 are relatively thick. A typical thickness of the aluminum oxide first gap layer is 300–1000 Å and a typical thickness of the nickel oxide pinning layer is 425 Å.

Figure 16:
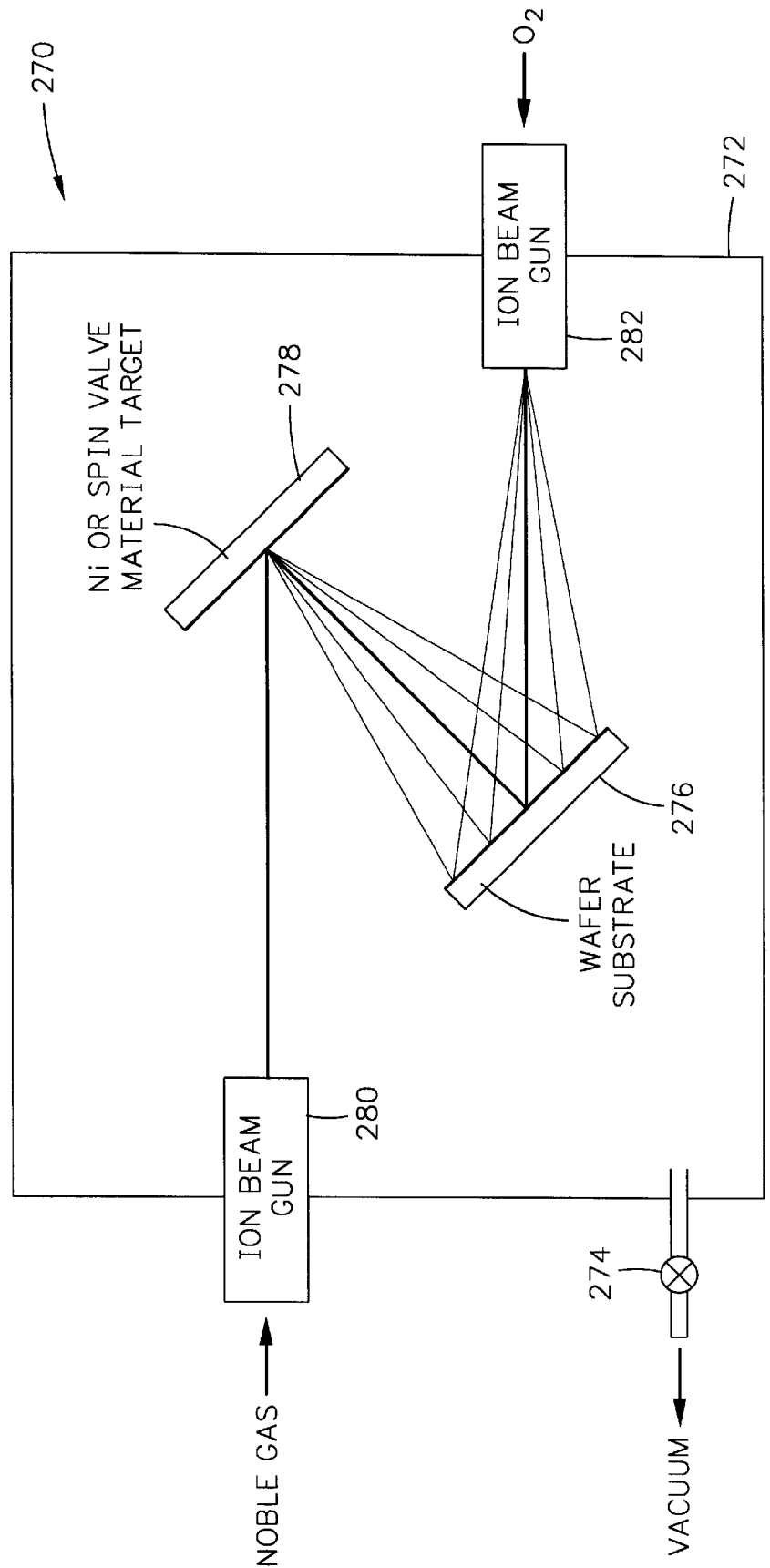
FIG. 16 is a schematic illustration of a second sputtering chamber which has a low sputter deposition rate.

A second sputtering chamber 270 is illustrated in FIG. 16. The sputtering chamber 270 includes a chamber 272 which has an inlet/outlet and valve assembly 274 for permitting drawing of a vacuum within the chamber. A wafer substrate 276 is mounted on a fixture (not shown) within the chamber. A target 278 is also mounted on a fixture (not shown) within the chamber. First and second ion beam guns 280 and 282 are located within the chamber and each gun may be capable of generating a plasma and accelerating ionized gas within the chamber. The ion beam gun 280 receives a noble gas, such as argon (Ar), krypton (Kr) or xenon (Xe), which is ionized within the gun and accelerated toward the target 278, which can be nickel (Ni) followed by subsequent spin valve materials. When the noble gas enters the ion beam gun 280 the gun generates a plasma which ionizes the gas and a grid in the gun accelerates the ions toward the target 278. The ions strike the target causing atoms of the material to be sputtered from the target 278 and deposited on the wafer substrate 276. Simultaneous with sputtering the target 278 the second ion beam gun 282 receives oxygen gas ($O_2$) which is disseminated into the chamber which causes oxygen ($O_2$) to envelope the wafer substrate 276 and oxidize the atoms of material sputter deposited thereon to form an oxide of the material, such as aluminum oxide ($Al_2O_3$) or nickel oxide (NiO).

In the following five examples a nickel oxide (NiO) pinning layer was sputter deposited in the first sputtering chamber 250 or the second sputtering chamber 270, depending upon the example, and the spin valve layers, including the pinned layer structure 204, were deposited in the second chamber 270. The second chamber 270 has a lower deposition rate than the first chamber 250. This was followed by resetting the magnetic spins of the antiferromagnetic (AFM) pinning layer structure 202 and taking measurements of the ferromagnetic coupling field ($H_F$) between the pinned layer structure 204 and the free layer 206, the magnetoresistive (MR) coefficient (dr/R), resistance (R) and the pinning field ($H_P$) in oersteds (Oe). The resetting of the AFM pinning layer is accomplished by subjecting a spin valve material layer to a field perpendicular to the ABS in the presence of heat for a predetermined period of time. For an AP pinned layer structure 204, this is 10,000 Oe at 230° C. for approximately one hour and for a single pinned layer structure 230, this is 1000 Oe at 230° C. for approximately one hour.

EXAMPLE 1

Figure 17A:
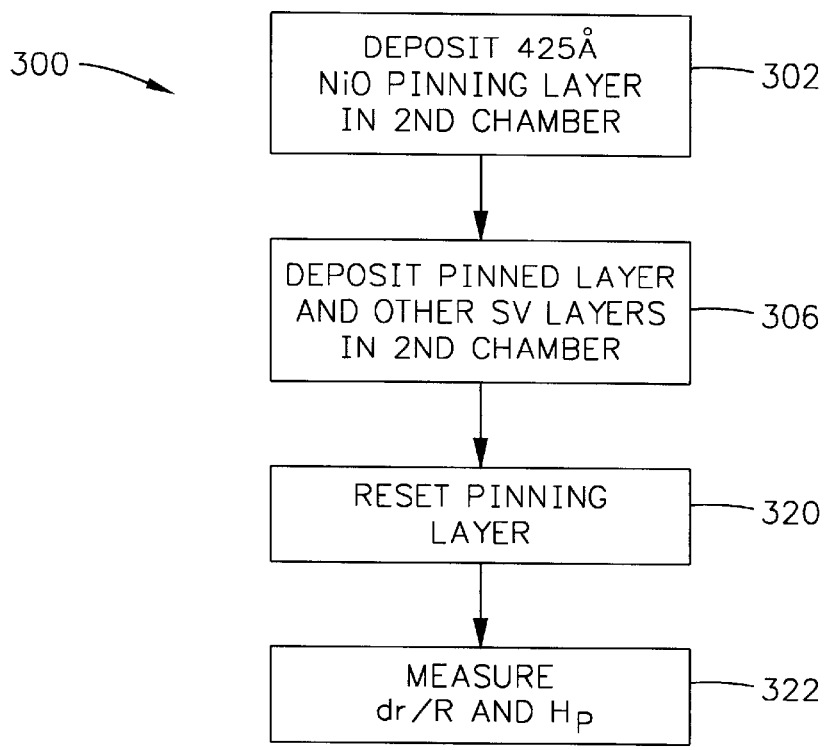
FIG. 17A is a block diagram of a first example of making and testing pinning and pinned layers of a spin valve sensor.

A first example of sputter depositing various layers for testing is shown by the block diagram in 300 in FIG. 17A. As shown in block 302 425 Å of nickel oxide (NiO) was sputter deposited in the second chamber 270 in FIG. 6, to form a nickel oxide (NiO) pinning layer. Without removing the wafer substrate from the second chamber and without breaking vacuum the pinned layer structure and other spin valve layers were sputtered deposited in the second chamber, as shown at 306. As discussed hereinabove, the pinning layer is reset at 320 and measurements are taken at 322. It should be noted from this example that the nickel oxide (NiO) pinning layer structure has not been exposed to the atmosphere or etched before depositing the pinned layer structure thereon. It was found that the ferromagnetic coupling field (HF) was 2.5 Oe, the MR coefficient (dr/R) was 5.28%, the resistance (R) was 21 ohms/sq.cm. and the pinning field ($H_P$) was 750 Oe. While the pinning field ($H_P$) is sufficient, the sputter deposition of the pinning layer and the pinned layers in the second sputtering chamber 270, which is designed for slow rate deposition, is too time consuming because of the large thickness of the pinning layer structure. Accordingly, there is a strong-felt need of a method that will increase the manufacturing throughput without degrading the exchange pinning ($H_P$) field between the pinning and pinned layers.

Figure 17B:
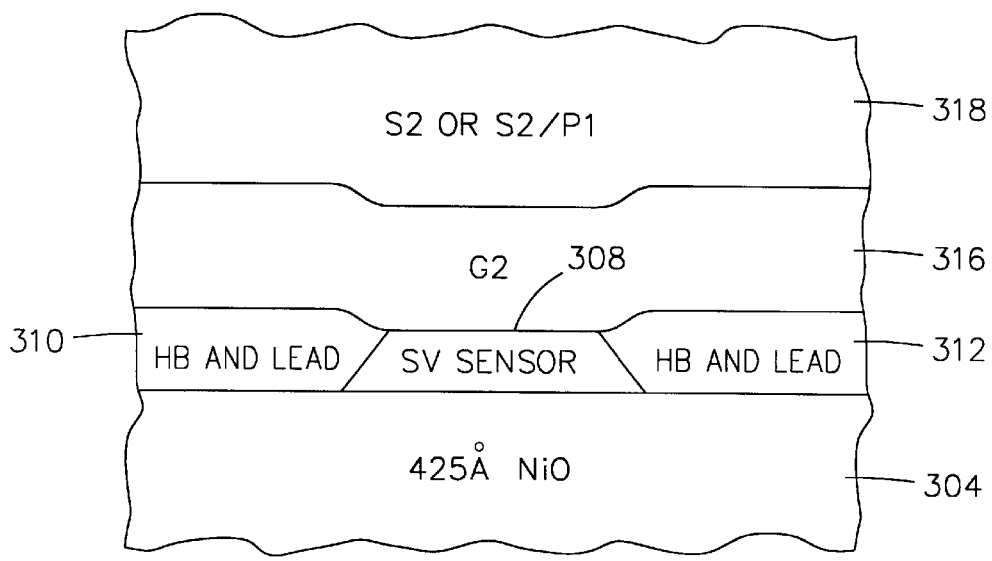
FIG. 17B is an ABS illustration of the read head made according to the method shown in FIG. 17A.

A magnetic head constructed according to the method of making the nickel oxide (NiO) pinning layer in block 302 is shown in FIG. 17B where, after constructing the pinning layer 304, the sensor 308 and first and second hard bias and lead layers 310 and 312 are constructed on the pinning layer 304 followed by formation of the second read gap layer 316 and the second shield layer (S2) or the second shield first pole piece layer (S2/P1) 318.

EXAMPLE 2

A second method of constructing the layers is shown by the block diagram 400 in FIG. 18A. In this example, 425 Å of nickel oxide (NiO) was sputter deposited in the first chamber 270, as shown at 402, to form the nickel oxide (NiO) pinning layer. The top exposed surface of the nickel oxide (NiO) pinning layer was exposed to the atmosphere in transition to the second chamber 270, as shown at 406. The top exposed surface of the nickel oxide (NiO) pinning layer was then sputter etched in the second chamber 270, as shown at 408. Next, the pinned layer structure and other spin valve layers, were formed on the pinning layer in the second chamber 270, as shown at 416. Thereafter, the pinning layer is reset, as shown at 424, and measurements are taken, as shown at 426. In this example, the ferromagnetic coupling field ($H_f$) was 2.99 Oe, the MR coefficient (dr/R) was 5.45%, the resistance (R) was 21 ohms/sq.cm. and the pinning field (He) was 350 Oe. It can be seen from Example 2 that the pinning field ($H_P$) was seriously degraded, as compared to Example 1. The pinning field ($H_P$) in Example 2 is less than 50% of the pinning field ($H_P$) in Example 1. Accordingly, the exposure of the nickel oxide (NiO) pinning layer to the atmosphere followed by sputter etching seriously degraded the exchange coupling field between the pinning and pinned layers.

A magnetic head constructed according to the method of making the nickel oxide (NiO) pinning layer in blocks 402, 406 and 408 is shown in FIG. 18B where, after constructing the pinning layer 404, the sensor 410 and first and second hard bias and lead layers 412 and 414 are constructed on the pinning layer 404 followed by formation of the second read gap layer 418 and the second shield layer (S2) or the second shield first pole piece layer (S2/P1) 420.

EXAMPLE 3

The Invention

FIGS. 19A and 19B illustrate a first example of the present invention wherein the method of practicing this invention is illustrated in block diagram at 500 in FIG. 19A.

In this example, an exemplary 400 Å nickel oxide (NiO) pinning layer is sputter deposited in the first chamber 250, as shown at 502, to form a first portion of the pinning layer. The wafer substrate is then removed from the first chamber 250 and transferred to the second chamber 270, as shown at 506, which exposes the first portion of the nickel oxide pinning layer to the atmosphere during the transition from the first chamber to the second chamber. The top exposed surface of the first portion of the nickel oxide (NiO) pinning layer is then sputter etched in the second sputtering chamber, as shown at 508. 10 Å of nickel oxide (NiO) is then sputter deposited in the second chamber 270, as shown at 510, to form a second portion of the nickel oxide (NiO) pinning layer. The metal layers of the spin valve sensor 514 are then sputter deposited in the second chamber 270, as shown at 520 in FIG. 19A. Thereafter, the pinning layer structure is reset as shown at 528 followed by measurements as shown at 530. In this example, the ferromagnetic coupling field ($H_F$) was 3.47 Oe, the MR coefficient (dr/R) was 5.45%, the resistance (R) was 21 ohms/sq.cm. and the pinning field ($H_P$) was 500 Oe. It can be seen from this example that the pinning field ($H_P$) was increased, as compared to Example 2, by sputter etching the top exposed surface of the first portion of the nickel oxide (NiO) pinning layer followed by sputter deposition of the second portion of the nickel oxide (NiO) pinning layer. However, the pinning field ($H_P$) in this example is less than the pinning field ($H_P$) in the first example where the pinning and pinned layers are sputter deposited in a single chamber without interruption.

A magnetic head constructed according to the method of making the nickel oxide (NiO) pinning layer in blocks 502, 506, 508 and 510 is shown in FIG. 19B where, after constructing the pinning layers 504 and 512, the sensor 514 and first and second hard bias and lead layers 516 and 518 are constructed on the pinning layer 504 followed by formation of the second read gap layer 522 and the second shield layer (S2) or the second shield first pole piece layer (S2/P1) 524.

EXAMPLE 4

The Invention

A second example of the present method of making the pinning layer structure is illustrated in block diagram form at 600 in FIG. 20A. As shown at 602 in FIG. 20A, 400 Å of a first portion of the nickel oxide (NiO) pinning layer is sputter deposited in the first chamber 250. The wafer substrate is then removed from the first chamber 250 and the first portion of the nickel oxide (NiO) pinning layer is exposed to the atmosphere as it is being transferred from the first chamber 250 to the second chamber 270, as shown at 606 in FIG. 20A. A top surface of the first portion of the pinning layer is then sputter etched in the second chamber 270, as shown at 610. Immediately following the sputter etching, 20 Å of a second portion of the nickel oxide (NiO) pinning layer, is sputter deposited in the second chamber 270, as shown at 614 in FIG. 20A. Immediately thereafter, the pinned layer structure and the other layers of the spin valve sensor are sputter deposited in the second chamber 270, as shown at 616, to form the spin valve sensor. Thereafter, the pinning layer structure is reset as shown at 628 followed by measurements as shown at 630. In this example, the ferromagnetic coupling field was 2.8 Oe, the MR coefficient (dr/R) was 5.4%, the resistance (R) was 21 ohms/sq.cm. and the pinning field ($H_P$) was 750 Oe. It can be seen from this example that the pinning field ($H_P$) was higher than the pinning fields in Examples 2 and 3 and the same as the pinning field in Example 1. Accordingly, this example shows that the present invention can be employed for obtaining the same pinning field as that obtained when the pinning layer and the pinned layer are made in the second chamber 270 without interruption.

A magnetic head constructed according to the method of making the nickel oxide (NiO) pinning layer in blocks 602, 606, 610 and 614 is shown in FIG. 20B where, after constructing the pinning layers 604 and 612, the sensor 618 and first and second hard bias and lead layers 620 and 622 are constructed on the pinning layer 612 followed by formation of the second read gap layer 624 and the second shield layer (S2) or the second shield first pole piece layer (S2/P1) 625.

EXAMPLE 5

The Invention

Figures 21A, 21B:
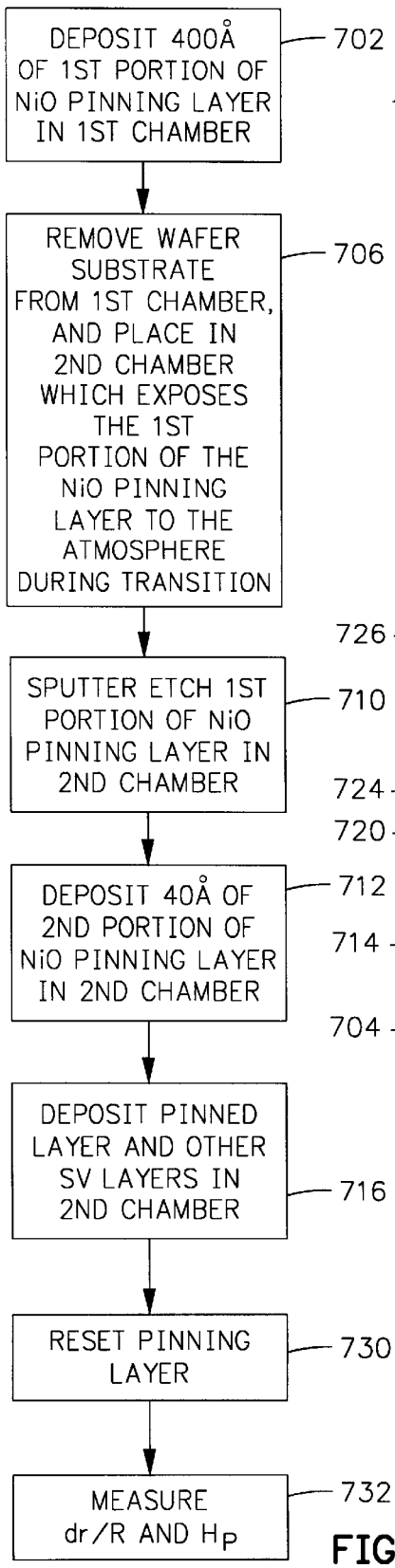
FIG. 21A is a block diagram of a fifth method of making and testing the pinning and pinned layers according to present invention.
FIG. 21B is an ABS illustration of a portion of the read head made according to the method shown in FIG. 21A.

Another example of the present invention is shown in block diagram at 700 in FIG. 21A. The first step is illustrated at 702 in FIG. 21A wherein 400 Å of nickel oxide (NiO) is sputter deposited in the first chamber 250 to form a first portion of the pinning layer. The first portion of the pinning layer is then exposed to the atmosphere as it is transferred from the first sputtering chamber 250 to the second sputtering chamber 270, as shown at 706 in FIG. 21A. A top surface of the first portion of the pinning layer is then sputter etched in the second chamber 270, as shown at 710 in FIG. 21A. Immediately thereafter, 40 Å of nickel oxide (NiO) is sputter deposited in the second chamber 270, as shown at 712, on the top surface of the first portion of the nickel oxide (NiO) pinning layer to form the nickel oxide (NiO) second portion. As shown at 716 in FIG. 21A, the pinned layer and the other layers of the spin valve sensor are sputter deposited in the second chamber 270 to form the spin valve sensor. Thereafter, the pinning layer structure is reset, as shown at 730, and the sensor is tested, as shown at 732. In this example, the ferromagnetic coupling field was 2.3 Oe, the MR coefficient (dr/R) was 5.35%, the resistance (k) was 21 ohms/sq.cm. and the pinning field ($H_P$) was 850 Oe. It can be seen from this example that the pinning field exceeded the pinning fields demonstrated by the other four examples. A surprising result was that the pinning field in this example exceeded by 100 Oe the pinning field demonstrated by Example 1. Accordingly, Example 5 is a preferred embodiment of the present invention.

A magnetic head constructed according to the method of making the nickel oxide (NiO) pinning layer in blocks 702, 706, 710 and 712 is shown in FIG. 21B where, after constructing the pinning layers 704 and 714, the sensor 718 and first and second hard bias and lead layers 720 and 722 are constructed on the pinning layer 714 followed by formation of the second read gap layer 724 and the second layer (S2) or the second shield first pole piece layer (S2/P1) 726.

The following chart illustrates the results of the above examples.

| Example | Sputter Etch | Atm. Exp. | Added NiO (A) | Hf (Oe.) | dr/R (%) | R (ohm/sq) | HP (Oe.) |
|---|---|---|---|---|---|---|---|
| 1 | No | None | 0 A(Std) | 2.5 | 5.28 | 21 | 750 |
| 2 | Yes | Yes | None | 2.99 | 5.45 | 21 | 350 |
| 3 | Yes | Yes | 10 | 3.47 | 5.45 | 21 | 500 |
| 4 | Yes | Yes | 20 | 2.8 | 5.4 | 21 | 750 |

-continued

| Example | Sputter Etch | Atm. Exp. | Added NiO (A) | Hf (Oe.) | dr/R (%) | R (ohm/sq) | HP (Oe.) |
|---------|--------------|-----------|---------------|----------|----------|------------|----------|
| 5 | Yes | Yes | 40 | 2.3 | 5.35 | 21 | 850 |

The ferromagnetic coupling fields ($H_F$), the MR coefficient (dr/R) and the resistance (R) did not change significantly between the various examples shown in the chart hereinabove. The ferromagnetic coupling field ($H_F$) is important from the standpoint that it affects the bias point of the free layer. The MR coefficient (dr/R) is important from the standpoint of the read sensitivity of the sensor. The resistance (R) is important from the standpoint of the amount of heat generated within the head.

It should be understood that the present invention is not only useful when a partially completed read head is transferred between first and second sputtering chambers, but may be employed in any instance where a significant amount of time lapses between the sputter deposition of the pinning layer and sputter deposition of the pinned layer. Further, the present invention is useful in any instance where the pinning layer is exposed to any type of gas which degrades the exposed surface of the pinning layer before sputter depositing the pinned layer thereon.

Clearly, other embodiments and modifications of this invention will occur readily to those of ordinary skill in the art in view of these teachings. Therefore, this invention is to be limited only by the following claims, which include all such embodiments and modifications when viewed in conjunction with the above specification and accompanying drawings.

I claim:

1. A method of making a nickel oxide (NiO) pinning layer for a sensor of a read head comprising the steps of:
    forming a first portion of the nickel oxide (NiO) pinning layer with an exposed top surface on a substrate;
    etching the top surface of the first portion of the nickel oxide (NiO) pinning layer to form a top etched surface;
    forming a second portion of the nickel oxide (NiO) pinning layer on the top etched surface of the first portion of the nickel oxide (NiO) pinning layer with the second portion having a top surface; and
    forming a ferromagnetic pinned layer structure on the top surface of the second portion of the nickel oxide (NiO) pinning layer for exchange coupling therebetween.

2. A method as claimed in claim 1 wherein the first portion of the nickel oxide pinning layer is formed with a thickness that is approximately 10 times a thickness of the second portion of the nickel oxide (NiO) pinning layer.

3. A method as claimed in claim 1 wherein the second portion of the nickel oxide (NiO) pinning layer is formed with a thickness between 20 Å–100 Å.

4. A method as claimed in claim 3 wherein the pinned layer structure is formed by:
    forming a ferromagnetic first antiparallel pinned layer on the second portion of the nickel oxide (NiO) pinning layer;
    forming a rithenium (Ru) coupling layer on the first antiparallel pinned layer; and
    forming a ferromagnetic second antiparallel pinned layer on the coupling layer that is magnetically antiparallel coupled to the first antiparallel pinned layer.

5. A method as claimed in claim 4 wherein the first portion of the nickel oxide (NiO) pinning layer is formed with a thickness of approximately 400 Å.

6. A method as claimed in claim 3 wherein the forming of the first and second portions of the nickel oxide (NiO) pinning layer is by sputter deposition and the etching of the top surface of the nickel oxide pinning layer is by sputter etching.

7. A method as claimed in claim 6 wherein the second portion of the nickel oxide (NiO) pinning layer is formed with a thickness of substantially 40 Å.

8. A method as claimed in claim 7 wherein the first portion of the nickel oxide (NiO) pinning layer is formed with a thickness of substantially 400 Å.

9. A method as claimed in claim 8 wherein the pinned layer structure is formed by:
    forming a ferromagnetic first antiparallel pinned layer on the second portion of the nickel oxide (NiO) pinning layer;
    forming a ruthenium (Ru) coupling layer on the first antiparallel pinned layer; and
    forming a ferromagnetic second antiparallel pinned layer on the coupling layer that is magnetically antiparallel coupled to the first antiparallel pinned layer.

10. A method of making a read head comprising the steps of:
    in a first sputtering chamber, sputter depositing nickel oxide (NiO) on a substrate to form a first portion of a nickel oxide (NiO) pinning layer with a top surface;
    removing the substrate from the first sputtering chamber and locating the substrate in a second sputtering chamber;
    in the second sputtering chamber, sputter etching the top surface of the first portion of the nickel oxide (NiO) pinning layer to produce a top etched surface;
    in the second sputtering chamber, sputter depositing nickel oxide (NiO) to form a second portion of the nickel oxide (NiO) pinning layer on the top etched surface of the first portion of the nickel oxide (NiO) pinning layer with the second portion having a top surface; and
    in the second sputtering chamber, sputter depositing a ferromagnetic pinned layer structure on the top surface of the second portion of the nickel oxide (NiO) pinning layer.

11. A method as claimed in claim 10 wherein the first portion of the nickel oxide (NiO) pinning layer is formed with a thickness that is substantially 10 times a thickness of the second portion of the nickel oxide (NiO) pinning layer.

12. A method as claimed in claim 10 wherein the second portion of the nickel oxide (NiO) pinning layer is sputter deposited with a thickness between 20 Å–100 Å.

13. A method as claimed in claim 12 wherein the second portion of the nickel oxide (NiO) pinning layer is sputter deposited with a thickness of approximately 40 Å.

14. A method as claimed in claim 13 including:
    before sputter depositing the second portion of the nickel oxide (NiO) pinning layer, sputter depositing a read gap layer in the first sputtering chamber on the substrate;
    said sputter depositing of nickel oxide (NiO) to form the first portion in the first sputtering chamber being on said read gap layer;
    after sputter depositing the pinned layer in the second sputtering chamber, sputter depositing a nonmagnetic electrically conductive spacer layer on the pinned layer structure; and
    in the second sputtering chamber, sputter depositing a ferromagnetic free layer on the spacer layer.

15. A method as claimed in claim 10 wherein the second sputtering chamber has a lower sputter deposition rate than the first sputtering chamber.

16. A method as claimed in claim 15 including:
   before sputter depositing the second portion of the nickel oxide (NiO) pinning layer, sputter depositing a read gap layer in the first sputtering chamber on the substrate;
   said sputter depositing of nickel oxide (NiO) to form the first portion in the first sputtering chamber being on said read gap layer;
   after sputter depositing the pinned layer in the second sputtering chamber, sputter depositing a nonmagnetic electrically conductive spacer layer on the pinned layer structure; and
   in the second sputtering chamber, sputter depositing a ferromagnetic free layer on the spacer layer.

17. A method as claimed in claim 16 wherein the second portion of the nickel oxide (NiO) pinning layer is sputter deposited with a thickness between 20 Å–100 Å.

18. A method as claimed in claim 17 wherein the pinned layer structure is formed by:
   forming a ferromagnetic first antiparallel pinned layer on the second portion of the nickel oxide (NiO) pinning layer;
   forming a ruthenium (Ru) coupling layer on the first antiparallel pinned layer; and
   forming a ferromagnetic second antiparallel pinned layer on the coupling layer that is magnetically antiparallel coupled to the first antiparallel pinned layer.

19. A method as claimed in claim 17 wherein the forming of the pinned layer structure consists of forming a single ferromagnetic pinned layer on the second portion of the nickel oxide (NiO) pinning layer.

20. A method of making a magnetic head assembly that has a read head and a write head comprising:
   making the read head as follows:
      in a first sputtering chamber, sputter depositing a nonmagnetic electrically insulative first read gap layer on a substrate;
      in the first sputtering chamber, sputter depositing nickel oxide (NiO) on the first read gap layer to form a first portion of a nickel oxide (NiO) pinning layer with an exposed top surface;
      removing said substrate from the first sputtering chamber and placing the substrate in a second sputtering chamber;
      in the second sputtering chamber, sputter etching the exposed top surface of the first portion of the nickel oxide (NiO) pinning layer to form a top etched surface;
      in the second sputtering chamber, sputter depositing a second portion of the nickel oxide (NiO) pinning layer on the top etched surface of the first portion of the nickel oxide (NiO) pinning layer with the second portion having a top surface;
      in the second sputtering chamber, sputter depositing a ferromagnetic pinned layer structure on the top surface of the second portion of the nickel oxide pinning layer;
      in the second sputtering chamber, sputter depositing a nonmagnetic electrically conductive spacer layer on the pinned layer structure;
      in the second sputtering chamber, sputter depositing a ferromagnetic free layer on the spacer layer; and
      forming a nonmagnetic electrically insulative second read gap layer on the free layer; and making the write head as follows:
      forming on the second read gap layer a ferromagnetic first pole piece layer that has a yoke region between a pole tip region and a back gap region;
      forming in an unordered sequence a nonmagnetic write gap layer on the first pole piece layer in the pole tip region and an insulation stack with a write coil embedded therein on the first pole piece layer in the yoke region; and
      forming a second pole piece layer on the write gap layer, on the insulation stack and on the first pole piece layer in the back gap region.

21. A method as claimed in claim 20 wherein the second sputtering chamber has a lower sputter deposition rate than the first sputtering chamber.

22. A method as claimed in claim 21 wherein the second portion of the nickel oxide pinning (NiO) layer is sputter deposited with a thickness between 20 Å–100 Å.

23. A method as claimed in claim 22 wherein the second portion of the nickel oxide (NiO) pinning layer is sputter deposited with a thickness of approximately 40 Å.

24. A method as claimed in claim 23 wherein the pinned layer structure is formed by:
   forming a ferromagnetic first antiparallel pinned layer on the second portion of the nickel oxide (NiO) pinning layer;
   forming a ruthenium (Ru) coupling layer on the first antiparallel pinned layer; and
   forming a ferromagnetic second antiparallel pinned layer on the coupling layer that is magnetically antiparallel coupled to the first antiparallel pinned layer.

25. A method as claimed in claim 23 wherein the forming of the pinned layer structure consists of forming a single ferromagnetic pinned layer on the second portion of the nickel oxide (NiO) pinning layer.

26. A method as claimed in claim 20 including:
   after forming the second read gap layer and before forming the first pole piece layer forming a ferromagnetic second shield layer on the second read gap layer;
   forming a nonmagnetic electrically insulative isolation layer on the second shield layer; and
   said forming of the first pole piece layer being on said isolation layer.

27. A method as claimed in claim 26 wherein the second sputtering chamber has a lower sputter deposition rate than the first sputtering chamber.

28. A method as claimed in claim 27 wherein the second portion of the nickel oxide (NiO) pinning layer is sputter deposited with a thickness between 20 Å–100 Å.

29. A method as claimed in claim 28 wherein the second portion of the nickel oxide (NiO) pinning layer is sputter deposited with a thickness of approximately 40 Å.

30. A method as claimed in claim 29 wherein the pinned layer structure is formed by:
   forming a ferromagnetic first antiparallel pinned layer on the second portion of the nickel oxide pinning layer;
   forming a ruthenium (Ru) coupling layer on the first antiparallel pinned layer; and
   forming a ferromagnetic second antiparallel pinned layer on the coupling layer that is magnetically antiparallel coupled to the first antiparallel pinned layer.

31. A method as claimed in claim 29 wherein the forming of the pinned layer structure consists of forming a single ferromagnetic pinned layer on the second portion of the nickel oxide (NiO) pinning layer.

* * * * *